(12) United States Patent
Ding et al.

(10) Patent No.: US 8,618,675 B2
(45) Date of Patent: Dec. 31, 2013

(54) THIN SEMICONDUCTOR DIE PACKAGE

(75) Inventors: Xiaoyi Ding, Lake Zurich, IL (US);
Jeffrey James Frye, Grayslake, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 13/281,734

(22) Filed: Oct. 26, 2011

(65) Prior Publication Data

US 2013/0105999 A1    May 2, 2013

(51) Int. Cl.
*H01L 23/29* (2006.01)
(52) U.S. Cl.
USPC .......................................... 257/778
(58) Field of Classification Search
USPC ............. 257/E23.01, 794, 786, 784, 778–779
See application file for complete search history.

(56) References Cited

U.S. PATENT DOCUMENTS

| | | | |
|---|---|---|---|
| 5,932,809 A | 8/1999 | Sparks | |
| 6,184,064 B1 | 2/2001 | Jiang et al. | |
| 7,412,892 B1 | 8/2008 | Gross | |
| 2012/0218454 A1* | 8/2012 | Suzuki et al. | 348/335 |

OTHER PUBLICATIONS

Search Report and the Written Opinion of the International Search Authority, PCT/US2012/062023, Feb. 27, 2013.

* cited by examiner

*Primary Examiner* — Hoa B Trinh

(57) ABSTRACT

A semiconductor die is attached to a substrate by a glass frit layer. Gas that might be trapped between the die and the glass frit layer during firing of the glass frit can escape through passages that are formed against the bottom surface of the die by topographies that extend away from and which are substantially orthogonal to the bottom of the die.

18 Claims, 5 Drawing Sheets

THIN SEMICONDUCTOR DIE PACKAGE

BACKGROUND

When a thin semiconductor die is attached to a substrate using a frit glass as the bonding material, interfacial voids may occur at the bonding interface. These voids are believed to be caused by gas that is trapped between the die and the glass frit during firing.

When a void is formed between a die and the frit, it is usually accompanied by stress concentrations, which are in turn caused by thermal mismatches between the die, bond material and substrate. These stress concentrations can adversely affect the performance of an electronic device formed into the die. A method and an apparatus for eliminating or substantially reducing the interfacial voids that sometimes form between a thin die and bond material such as the frit glass, would be an improvement over the prior art.

DETAILED DESCRIPTION

Figure 1:
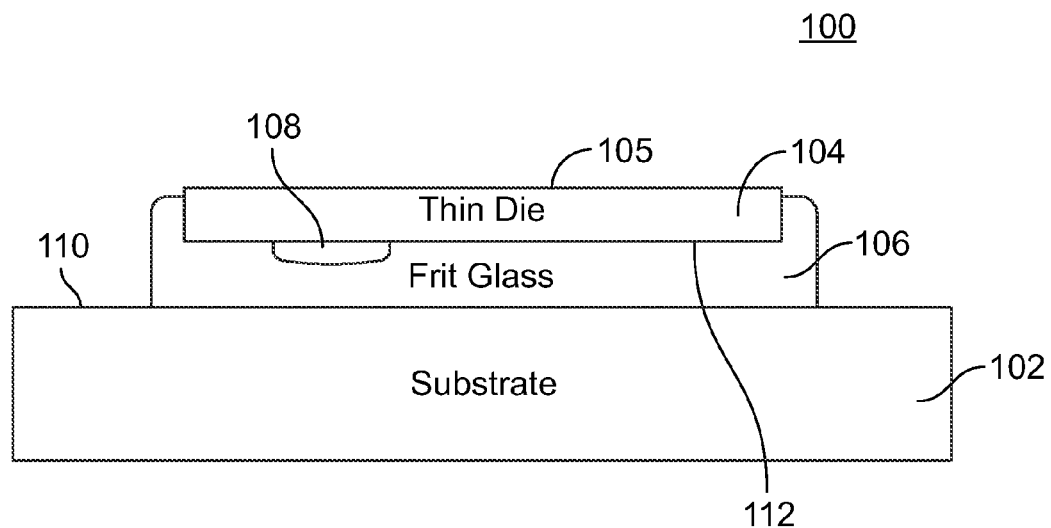
FIG. 1 is a cross-section of a prior art semiconductor apparatus attached to a substrate by a glass frit.

FIG. 1 is a cross-sectional diagram of a prior art semiconductor apparatus 100 comprised of a package substrate 102 which supports a semiconductor die 104 that is embedded in a glass frit adhesive layer 106. The die 104 is formed with an electronic circuit 105, such as a piezoresistive bridge commonly used in pressure sensors but other devices and circuits can be formed into the die 104.

The glass frit adhesive layer 106 is comprised of ground glass particles in a paste. The particle-bearing paste is screen printed on to the upper surface 110 of the substrate 102 and heated to burn off volatile solvents in the paste and to partially glaze the outside surface of the paste. The die 104 is then placed on top of the pre-glazed frit glass. When the glass frit is fully cured by a firing process, it provides a strong bond between the thin semiconductor die 104 and the substrate 102. Equally important is that its coefficient of thermal expansion, $T_{ce}$, can be made to be close to those for the semiconductor die 104 and the substrate 102.

As shown in FIG. 1, the thin semiconductor die 104 is embedded into the glass frit layer 106. The semiconductor die 104 embeds itself into the glass frit layer 106 during a firing process during which the temperature of the glass frit layer 106 is raised to a point where the glass will melt. When the glass frit layer 106 has become molten, a die 104 placed on top of the layer will gradually sink into it embedding itself into the glass frit layer 106 sealing the die therein and mounting it to the substrate at the same time.

A consequence of the prior art structure depicted in FIG. 1 and the prior art method of attaching a thin die to a substrate using a glass frit layer is that the interfacial voids 108 are often created between the die 104 and the frit layer 106 during the firing process. The voids are formed by trapped gases which can be from ambient air or out-gassing of the organic solutions used in the glass frit layer 106. When a volume of gas is trapped to create a void 108, pressure from the trapped gas inhibits reflowing/wetting of the glass frit on the semiconductor die surface facing the glass frit layer in localized areas. These localized trapped gases create interfacial voids after the firing process, which create localized stress concentration around them. Since the die 104 is very thin, the localized stress concentrations can adversely affect performance of the semiconductor devices formed into the die and can even cause the die 104 to crack making it unusable. A structure and method for reducing or eliminating the entrapment of gases in a glass frit adhesive layer would be an improvement as would a semiconductor apparatus that is formed without voids in a glass frit attachment layer.

Figure 2:
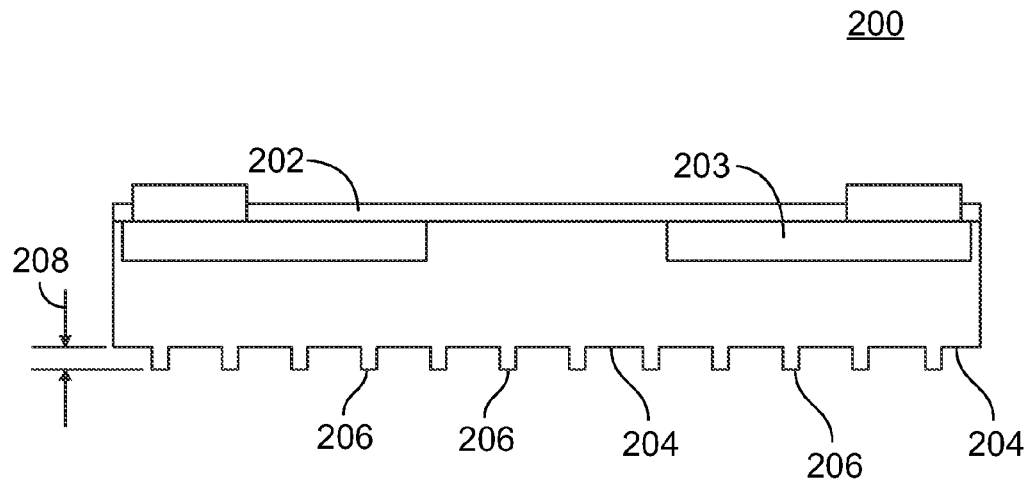
FIG. 2 is a photograph of a semiconductor die the planar bottom surface of which is provided with topographies or posts that provide pathways along which trapped gas can travel and escape.

FIG. 2 is a cross-sectional diagram of a semiconductor die 200. Similar to the die depicted in FIG. 1, the die 200 in FIG. 2 has a substantially planer top or upper surface 202 in which is formed an electronic circuit 203, such as a piezo-resistive bridge or perhaps an integrated circuit. Unlike the die depicted in FIG. 1, the die 200 depicted in FIG. 2 has substantially planer bottom surface 204 which is formed or provided with several columnar posts 206 which extend away from and which are substantially orthogonal to the substantially planer bottom surface 204. Each of the posts 206 has a nominal height 208 which is considered herein to be the distance between the planer bottom surface 204 and the top or upper most point of each post 206. As explained more fully below, the posts are formed on top of, or extending up from the bottom surface of a die; they are not indentations into the bottom surface of a die. The posts thus formed provide pathways along which and through which trapped gas can travel and thereby escape entrapment between the bottom surface 204 and a molten glass frit layer during firing of the glass frit layer.

Figure 3A:
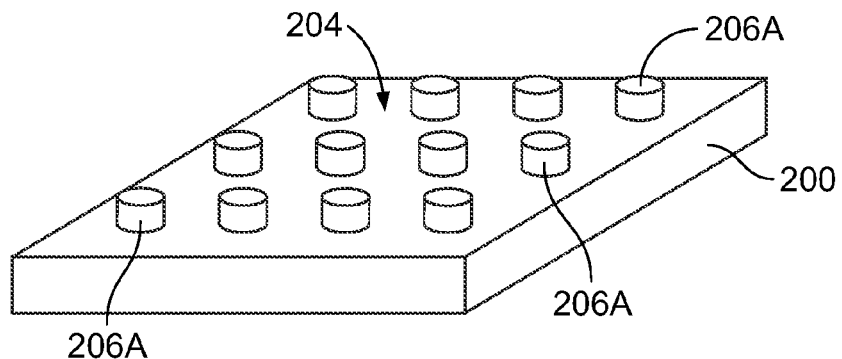
FIG. 3A and FIG. 3B are isolated views of the two different columnar topographies.
Figure 3B:
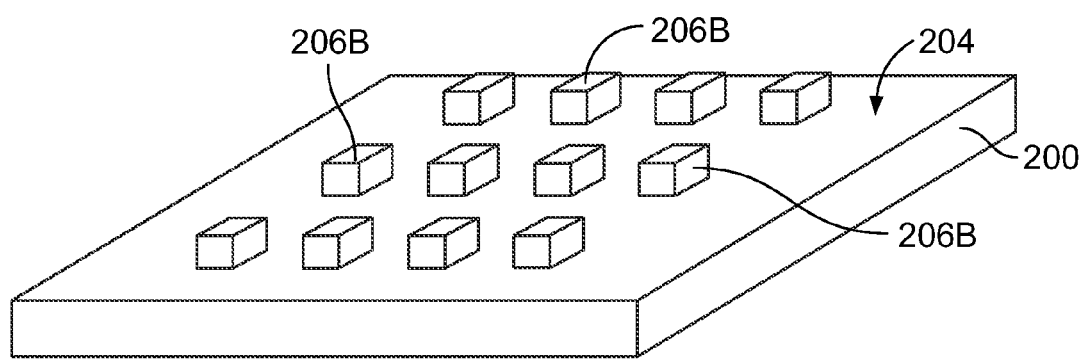

FIG. 3A and FIG. 3B are isolated views of the two different columnar posts extending away from the planar bottom 204 of the semiconductor die 200 shown in FIG. 2. As FIGS. 3A and 3B are drawn, the posts 206 project upwardly from the planar bottom 204, away from the planar bottom surface 204 and are substantially orthogonal to the bottom surface 204 of the die 200.

FIG. 3A depicts posts 206A which have a shape in the form of a right circular cylinder, which is considered herein to be a right circular cylinder with parallel circular bases and a wall of constant circular cross-section. In FIG. 3B, the posts 206B have a shape reminiscent of a cube or a rectangular parallelepiped a cube bounded by six surfaces. A parallelepiped is shape of which all the faces are rectangles. Those of ordinary skill in the art will recognize that other equivalent embodiments include posts that have shapes reminiscent of or which are similar to a prism, a regular pyramid, a frustum, which is the shape that remains after a pyramid is truncated along a plane parallel to its base. Other equivalent shapes for posts include zones of a sphere, a cone, a truncated right circular cone, and the frustum of a right circular cone.

The cylindrical-shaped posts 206A depicted in FIG. 3A and the rectangular or cuboid-shaped posts 206B depicted in 3B and all of the shapes described above are collectively referred to hereinafter as topographies. A topography is considered herein to be a physical feature or configuration of the planar bottom surface 204 of the die 200.

Figure 4A:
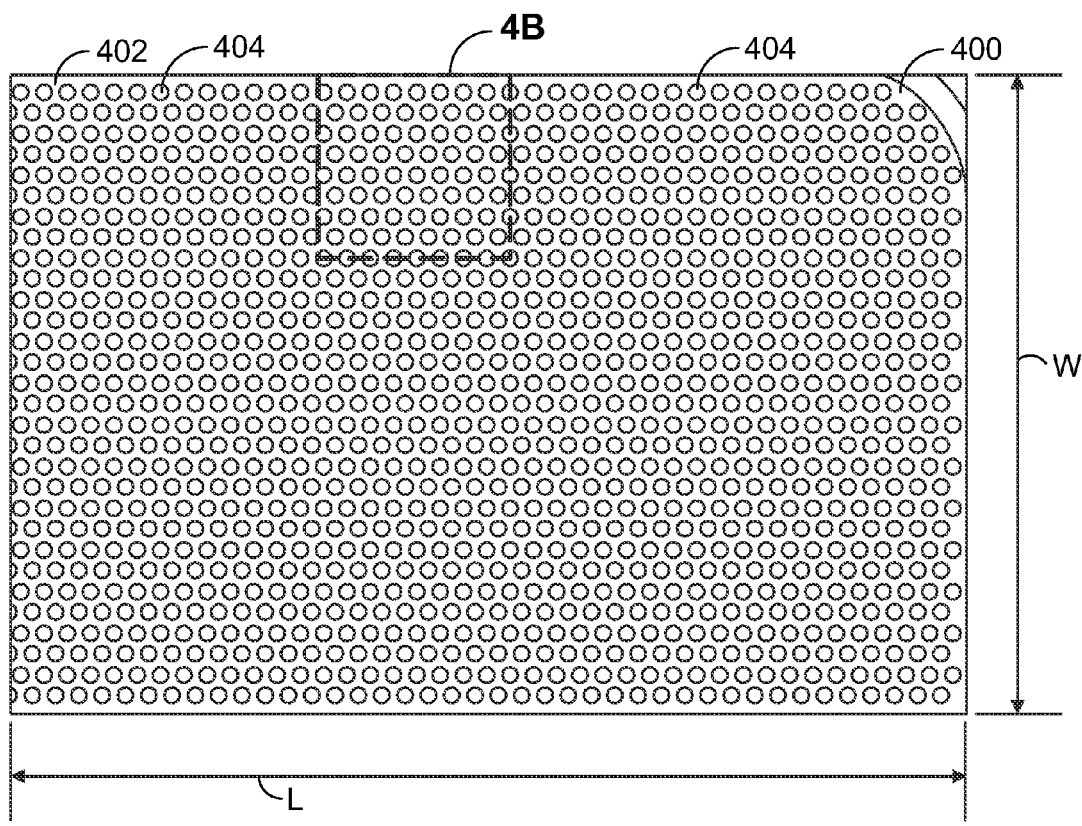
FIG. 4 is a plan or top view of the bottom side of a semiconductor die showing the spacing and arrangement of surface topographies.

FIG. 4 is a photograph of a portion of the bottom side 400 of a thin semiconductor die 402. In FIG. 4A the dark circles 404 are the top surfaces of posts that extend upwardly from the planer bottom surface 402 of the die 400.

Figure 4B:
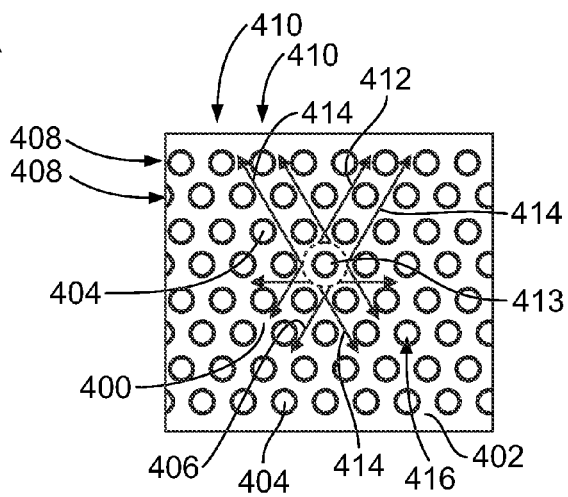

FIG. 4B is an isolated portion of the device shown in FIG. 4A. Each of the dark circles shown in FIG. 4B is the top of a "topography" or post 404 that projects upwardly or away from the planar bottom surface 402. The arrows identified by reference numeral 412 and which extend from a centrally-located topography 413 lie within and therefore identify linear or substantially linear paths 414 that extend away from each topography 404, including the centrally-located topography 413 shown in FIG. 4B. Gas that might be trapped between an adhesive frit layer and the bottom surface 402 can escape along the paths 414 between the topographies 404.

As shown in the figure, the topographies 404 are evenly spaced from each other and arranged in horizontal rows 408 and vertical columns 410. The topographies of each row 408 and the topographies of each column 410 is offset from each correspondingly adjacent row and column by the distance between the centers of adjacent topographies. Reference numeral 416 identifies the center of a topography. Those of ordinary skill in the art will recognize that the distance between centers 416 in a row and centers 416 in a column are the same. In an alternate embodiment, neither the rows 408 nor the columns 410 are offset relative to each other such that the topographies 404 are arranged to form a rectilinear or square matrix.

The total planar area A, of the die 400 is equal to the product of the width W by its length L of the die 400. Since each topography 404 has a top surface area $a_{topography}$, each topography 404 occupies a fractional portion of the total planar area A of the die 400. The sum of the top surface areas of all of the topographies 404, occupy a corresponding fractional portion A' of the total area A, where A' is equal to the number of the topographies n, multiplied by each of their individual top surface areas $a_{topography}$. The portion of the total planar area A of the die 400 occupied by the total top surface area A' is referred to herein as the % die bond side outmost surface area. It can be expressed using equation 1 below.

$$\% \text{ die bond side outmost surface area} = \frac{n \times a_{topography}}{A} \times 100 \quad (1)$$
$$= \frac{A'}{A} \times 100$$

The ability of the paths 414 to allow gas to escape has been observed to depend on the % die bond side outmost surface area. An optimal % die bond side outmost surface area is believed to be about twenty percent (20%). Effective but less optimal die bond side outmost surface areas between about ten percent (10%) and up to fifty percent (50%) will also help trapped gas escape from between a die and glass frit bonding layer.

One of the examples for the semiconductor dies depicted in the figures is for the application of the pressure sensors, in which the die is made of single crystalline silicon, and has a typical thickness of about 15 microns. The area A of the dies is on the order of 1 square millimeter (1 mm$^2$).

As can be seen in FIG. 4A, the diameter of each topography 404 is quite small while the number of topographies or posts is quite large. The topographies 404 are therefore preferably formed using well-known prior art semiconductor processing techniques that include chemical etching or reactive ion etching (RIE) of silicon. The topographies can also be formed by the materials formed by plasma enhanced chemical vapor deposition (PECVP). In an alternate embodiment the topographies can be formed of a dielectric such as an oxide or nitride deposited on to the bottom surface 400 of the die.

The topographies preferably have an average height less than about 2 microns for a thin die of about 20 microns thick in order to allow gas to escape from between the die and frit layer. Other heights of more than 2 microns are also possible for a die thicker than 30 microns.

Figure 5:
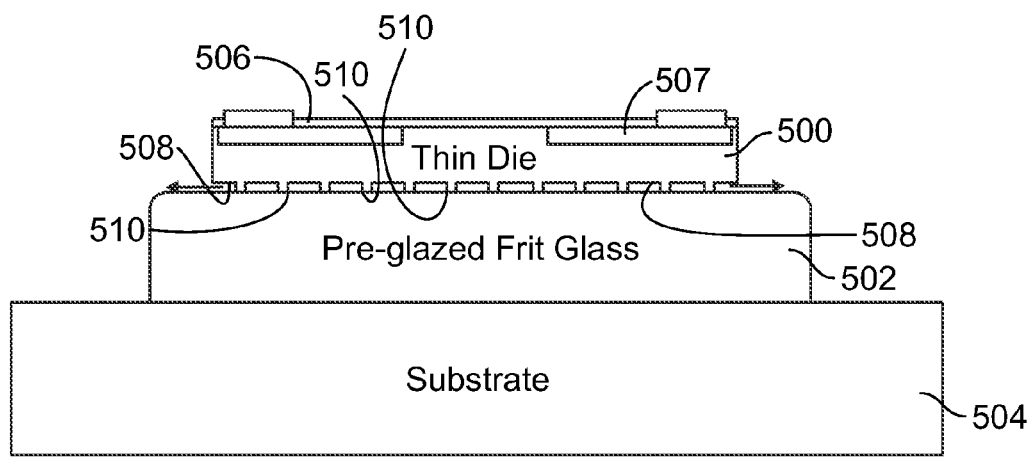
FIG. 5 is a cross sectional diagram of a semiconductor apparatus prior to firing of a glass frit attachment layer.

FIG. 5 is a cross sectional diagram of a semiconductor apparatus. A thin semiconductor die 500 having a thickness between about 10 and 50 microns is placed atop a glass frit layer 502. The pre-glazed glass frit layer 502 is in turn on top of a substrate layer 504 which can be a metal, ceramic, glass or silicon. The top 506 of the die 500 is provided with a semiconductor device 507 such as a piezoresistive pressure sensor.

The bottom surface 508 of the die 500 is provided with several topographies 510, such as the topographies 404 shown in FIG. 4. Each of the topographies 510 extends away from (upwardly or downwardly, depending upon a frame of reference for the two directions) and which is substantially orthogonal to the bottom 508 of the die 500. As shown in FIGS. 4A and 4B, the topographies 510 shown in FIG. 5 are also evenly distributed across the substantially planar bottom surface 508 of the die 500.

As can be seen in FIGS. 3A, 3B and 4A and 4B, the topographies 510 extension away from the bottom surface 508 of the die 500 and their even and regular spacing from each other provides passageways for trapped gas to escape through. The spaces between the topographies 510 thus define passageways along the bottom surface 508 of the die through which gas can travel during the embedment of the die 500 into the glass frit layer 502 during a firing process by which the glass frit is heated to a melting point and the semiconductor die 500 allow to embed itself into the molten glass frit layer 502.

Figure 6:
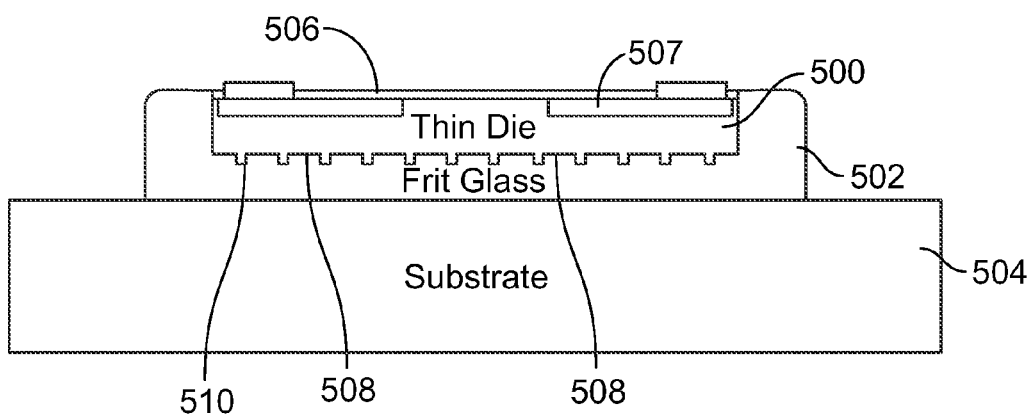
FIG. 6 is a cross sectional diagram of a semiconductor apparatus after firing of a glass frit attachment layer.

FIG. 6 is a cross sectional view of the semiconductor apparatus depicted in FIG. 5 but with the thin semiconductor die 500 embedded into the glass frit layer 502 by the firing process. The frit layer 502 bonds the die 500 to the substrate 504. The topographies 510 provide passages for trapped gas to escape during a firing process during which the glass frit layer 502 is heated to a temperature at which the die 500 can move downwardly into the molten glass. The topographies also provide additional surface area to which the molten glass can attach to the die.

Figure 7:
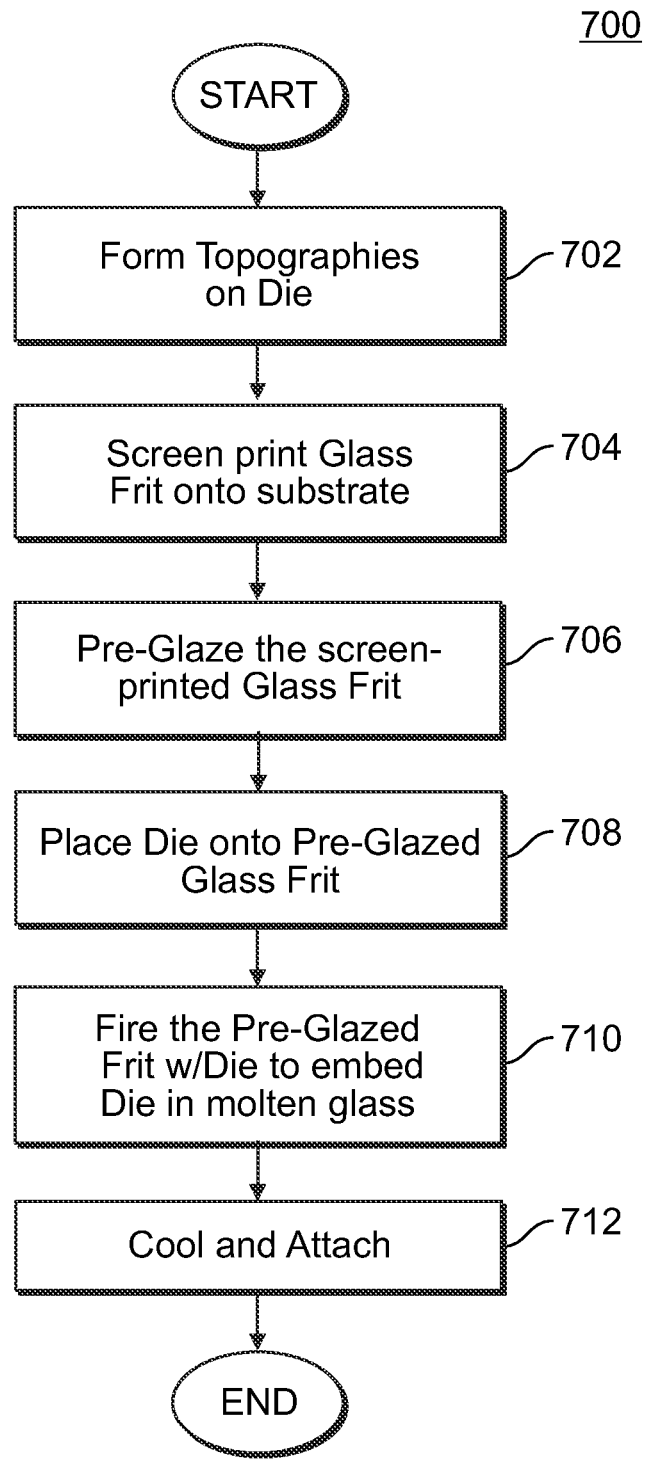
FIG. 7 is a flow chart depicting steps of a method of forming a semiconductor apparatus, such as the one depicted in FIGS. 2-6.

FIG. 7 depicts steps of a method 700 of forming a semiconductor device such as the one depicted in FIGS. 2-6. As a preliminary matter, at step 702 topographies are formed on to a bottom surface of a semiconductor die. The topographies can be of any shape described above but they are preferably distributed evenly across the "bottom" side of the die and spaced apart from each other to define gas passageways between them. The total top surface area of the topographies should occupy a fractional portion of the total planar area of the semiconductor die that should be less than about 50 percent, more than 10 percent and preferably about 20 percent.

At step 704, a glass frit layer is screen printed on to a substrate. Screen printing processes are well-known in the art. Further description of the screen printing process is omitted for brevity.

At step 705, the printed frit layer is pre-glazed to partially melt at least the exterior surface of the screen printed frit layer. Pre-glazing the glass frit at least partially solidifies the exterior surface of the glass frit layer providing a surface on to which a die can be placed and supported.

At step 708, a die having the pre-formed topographies described above is placed on to the glass frit layer with the topographies facing the glass frit layer.

Finally, at step 710 the die, the glass frit and the substrate are reheated to a temperature at which the glass frit will melt. Once the glass frit is molten, the die will embed itself into the molten glass providing a rigid attachment of the die to a substrate. After the molten glass cools at step 712, the semiconductor device formed by the process 700 is ready for rest of assembly steps in making the functional devices, such as a pressure sensor.

In a preferred embodiment, the glass frit was comprised of a lead-boron silicon glass because it has a relatively low melting point and thermal coefficient of expansion or $T_{CE}$ close to substrate and silicon. Any other glass which is considered to be a low temperature melting point glass with TCE close to substrate and silicon, would be appropriate for use with the method described above.

Those of ordinary skill in the art will appreciate that the several topographies that extend from the bottom side of a semiconductor die will facilitate the passage of trapped gases from between the layer of glass frit and the die prior to bonding of the glass to it. In a preferred embodiment the topographies are considered to be micro-posts in that they are preferably formed of a columnar-shape. The die is preferably a single crystal of silicon which facilitates the formation of the posts using conventional semiconductor processing techniques. As stated above, the post can also be dielectric that is formed on to the side of the die as a siliconoxide or silicon nitride layer.

The foregoing description is for purposes of illustration only. The true scope of the invention is set forth in the appurtenant claims.

What is claimed is:

1. A semiconductor apparatus comprising:
   a semiconductor die formed from a semiconductor material, the semiconductor die comprising first and second opposing sides, each side having a corresponding area, the first side of the semiconductor die formed to provide a plurality of topographies formed from the semiconductor material comprising the die and extending from the first side of the die, each topography having a height and a cross sectional shape and a top surface area, the plurality of topographies being distributed across the first side of the die and spaced apart from each other to define spaces between them, the top surface area of each topography occupying a corresponding fractional portion of the planar area of the first side, the sum of the top surface areas of the topographies being less than about fifty percent of the planar area of the first side, spaces between the evenly distributed topographies extending across the first area and providing a gas passage along the first side of the die.

2. The semiconductor apparatus of claim 1, further comprising:
   a layer of glass bonded against the first side of the die and bonded to the topographies such that the topographies are embedded into the glass.

3. The semiconductor apparatus of claim 1, wherein the second side of the die is comprised of at least one electrical circuit.

4. The semiconductor apparatus of claim 1, wherein the second side of the die is comprised of at least one piezo-resistive bridge.

5. The semiconductor apparatus of claim 1, wherein the topographies and spaces are configured to provide a plurality of gas passages, which are configured to facilitate the passage of gas from between the layer of glass and the die prior to bonding of the glass to the die.

6. The semiconductor apparatus of claim 1, wherein the glass is substantially free of voids located between the glass and the first side of the die.

7. The semiconductor apparatus of claim 1, wherein the topographies are posts formed by at least one of: reactive ion etching of silicon, chemical etching of silicon, and materials formed by at least one of: plasma enhance chemical vapor deposition and thermal oxidation of silicon.

8. The semiconductor apparatus of claim 1, wherein the topographies have an average height less than about two microns.

9. The semiconductor apparatus of claim 1, wherein the top surface area of the topographies occupy a portion of the planar area of the first side by less than about fifty percent.

10. The semiconductor apparatus of claim 1, wherein the die has a thickness less than about fifty microns.

11. The semiconductor apparatus of claim 1, wherein the die is a single crystal of silicon.

12. The semiconductor apparatus of claim 1, wherein the topographies are comprised of silicon.

13. The semiconductor apparatus of claim 1, wherein the topographies are comprised of a dielectric formed onto the first side of the die.

14. A semiconductor apparatus comprised of:
   a thin semiconductor die comprised of semiconductor material, first and second sides, and a plurality of posts formed from the semiconductor material, extending from the first side and being substantially evenly distributed across the first side of the die, the top surface area of each post occupying a fractional portion of the planar area of the first side, the sum of the top surface areas of the posts occupying less than about fifty percent of the planar area of the first side, spaces between the evenly distributed topographies extending across the first area, the second side of the die being comprised of at least one piezo-resistive bridge embedded therein;
   a layer of glass having first and second sides, the first side bonded against the first side of the die and bonded to the posts such that the posts are embedded into the glass; and
   a substrate layer bonded to the second side of the layer of glass.

15. The semiconductor apparatus of claim 14, wherein the thin semiconductor die has a thickness less than about thirty microns.

16. The semiconductor apparatus of claim 14, wherein the layer of glass is comprised of a low-melting point glass frit.

17. The semiconductor apparatus of claim 14, wherein the substrate layer is comprised of at least one of: metal; ceramic, glass and silicon.

18. The semiconductor die of claim 1, wherein the topographies are adapted to engage a glass frit and to allow gas between the die and the frit to escape through passages formed by the topographies during the glass firing process.

* * * * *